United States Patent [19]
Kudo et al.

[11] Patent Number: 5,633,526
[45] Date of Patent: *May 27, 1997

[54] PHOTODIODE ARRAY AND METHOD FOR MANUFACTURING THE SAME

[75] Inventors: Koichi Kudo; Yasuo Aki, both of Kyoto, Japan

[73] Assignee: Rohm Co., Ltd., Kyoto, Japan

[*] Notice: The term of this patent shall not extend beyond the expiration date of Pat. No. 5,523,610.

[21] Appl. No.: 429,296

[22] Filed: Apr. 24, 1995

Related U.S. Application Data

[63] Continuation-in-part of Ser. No. 272,311, Jul. 7, 1994.

[30] Foreign Application Priority Data

Nov. 1, 1992 [JP] Japan .................. 4-303754

[51] Int. Cl.$^6$ .................. H01L 29/76; H01L 27/14; H01L 27/01
[52] U.S. Cl. .................. 257/431; 257/328; 257/350
[58] Field of Search .................. 257/431, 446, 257/350, 443, 461, 544, 910, 920, 328, 448, 457, 459, 465, 347, 654, 928; 437/205, 916, 141, 180

[56] References Cited

U.S. PATENT DOCUMENTS

| | | |
|---|---|---|
| 3,690,953 | 9/1972 | Wise . |
| 3,745,424 | 7/1973 | Ohuchi et al. . |
| 3,988,774 | 10/1976 | Coben-Solal et al. . |
| 3,994,012 | 11/1976 | Warner, Jr. . |
| 4,896,199 | 1/1990 | Tsuzuki et al. ............ 257/328 |
| 5,045,709 | 9/1991 | Ogawa . |
| 5,324,971 | 6/1994 | Notley ............ 257/356 |
| 5,477,065 | 12/1995 | Nakagawa et al. ............ 257/146 |
| 5,523,610 | 6/1996 | Kudo et al. ............ 257/443 |

FOREIGN PATENT DOCUMENTS 5-175537   7/1993   Japan .

*Primary Examiner*—Mahshid D. Saadat
*Assistant Examiner*—Jhihan B. Clark
*Attorney, Agent, or Firm*—Nikaido Marmelstein Murray & Oram LLP

[57] ABSTRACT

A photodiode array includes an insulating film; a semiconductor layer of a first conductivity type provided on the insulating film; a positive electrode and negative electrode formed on the semiconductor layer; and a plurality of pn junctions formed in series in the semiconductor layer between the positive and negative electrodes. The pn junctions are formed by a diffusion layer of a second conductivity type formed in the semiconductor layer and another diffusion layer of the first conductivity type formed in the diffusion layer, so as to terminate on the insulating film.

5 Claims, 9 Drawing Sheets

PHOTODIODE ARRAY AND METHOD FOR MANUFACTURING THE SAME

CROSS-REFERENCE TO RELATED APPLICATION

This is a continuation-in-part of application Ser. No. 272,311 filed on Jul. 7, 1994 pending.

BACKGROUND OF THE INVENTION

The present invention relates to a photodiode array and a method for manufacturing the same. More particularly, it relates to a photodiode array which contributes to a reduction in both chip size and production cost, and to a method for manufacturing such a photodiode array.

Photodiode arrays have hitherto been used in, for example, solid state relays (SSRs). A representative example of such photodiode arrays is of a structure such as shown in FIG. 15, wherein portions of an n-type polysilicon substrate 31 are isolated from each other with a silicon oxide film 32; a p-type impurity diffusion layer 33 is formed in each of the isolated portions and, further, an $n^+$-type impurity diffusion layer 34 of high concentration is formed in the surface layer of the diffusion layer 33, so that a multiplicity of pn junctions are arranged in the substrate 31; and these pn junctions are serially connected to each other with a conductive film 36, with appropriate insulation by means of a silicon oxide film 35.

An alternative prior art photodiode array is disclosed in, for example, Japanese Unexamined Patent Publication No. 22487/1991. This photodiode array is of the structure shown in FIG. 16 wherein photodiodes 24 comprising single-crystalline islands isolated from each other with a silicon oxide film 28 are formed in a dielectric-isolation substrate 23, and serially connected to each other with an aluminum wiring 25.

In either prior art array, however, the structure thereof is complicated because the oxide film 32 or 28 for isolation is formed in the semiconductor substrate 31 or 23 and a pn junction is formed in each of the single-crystalline semiconductor islands isolated with the oxide film 32 or 28. This results in a poor yield at the production process and a rise in the price of products.

In an attempt to overcome such problems of the prior art arrays, a photodiode array wherein an impurity-doped semiconductor layer is formed on a semiconductor substrate covered with an insulating film, and impurity-diffusion layers of a conductivity type opposite to that of the semiconductor layer are formed in the semiconductor layer so as to extend down to the insulating film, thereby forming pn junctions arranged laterally (refer to Japanese Patent Application No. 355876/1991) have been formerly proposed.

This photodiode array, shown in FIG. 17, is characterized by comprising a substrate 41, an insulating film 42 formed on the substrate 41, a semiconductor layer 43 doped with an impurity of first conductivity type insulating film 42, second-impurity diffusion layers 44 of a polarity opposite to that of the semiconductor layer 43 which are formed in the semiconductor layer 43 so as to provide a plurality of pn junctions arranged laterally, and high-concentration diffusion layers 45 of the same polarity with the semiconductor layer 43 which are respectively formed for the pn junctions defined by the layers 43 and 44 and which are situated in the surface layer opposite to the insulating film, whereby the pn junctions arranged laterally are utilized. Since this photodiode array is of a simple structure, it offers an improvement in production yield while realizing a decrease in the price of the products.

The present invention aims to further improve the formerly-proposed photodiode array. It is, therefore, an object of the present invention to provide a photodiode array which enjoy a reduced chip size with reduced cost.

SUMMARY OF THE INVENTION

According to the present invention, there provided a photodiode array comprising:

an insulating film;

a semiconductor layer of a first conductivity type provided on said insulating film;

a positive electrode and negative electrode formed on said semiconductor layer; and a plurality of pn junctions formed in series in said semiconductor layer between said positive and negative electrodes;

wherein said pn junctions are formed by a diffusion layer of a second conductivity type formed in said semiconductor layer and another diffusion layer of the first conductivity type formed in said diffusion layer, so as to terminate on said insulating film.

According to another aspect of the present invention, there is also provided a method for manufacturing a photodiode array, comprising the steps of:

(a) forming an insulating film on a surface of a semiconductor substrate;

(b) providing a semiconductor layer containing an impurity of first conductivity type on the insulating film;

(c) diffusing an impurity of second conductivity type from a surface of the semiconductor layer so as to terminate on the insulating film to form a diffusion layer of the second conductivity type defining a pn junction;

(d) further diffusing an impurity of the first conductivity type within the diffusion layer of the second conductivity type so is to terminate on the insulating film to form diffusion layer of the first conductivity type defining further pn junctions;

(e) forming a thin film conductive layer in a surface of the semiconductor layer over the pn junctions in a backward direction relative to a positive electrode and a negative electrode, thereby short-circuiting said pn junction in the backward direction.

In the photodiode array of the present invention, the semiconductor layer of the first conductivity type is formed on the substrate with the insulating film sandwiched therebetween, the diffusion layer of the second conductivity type is formed in the semiconductor layer down to the insulating film, and further the diffusion layer of the first conductivity type is formed within the diffusion layer of the second conductivity type, whereby pn junctions are formed laterally. By virtue of this arrangement, the area of pn junctions per unit area is increased.

DETAILED DESCRIPTION

A photodiode array and a manufacturing method therefor according to the present invention will now be described with reference to the attached drawings.

Figure 1:
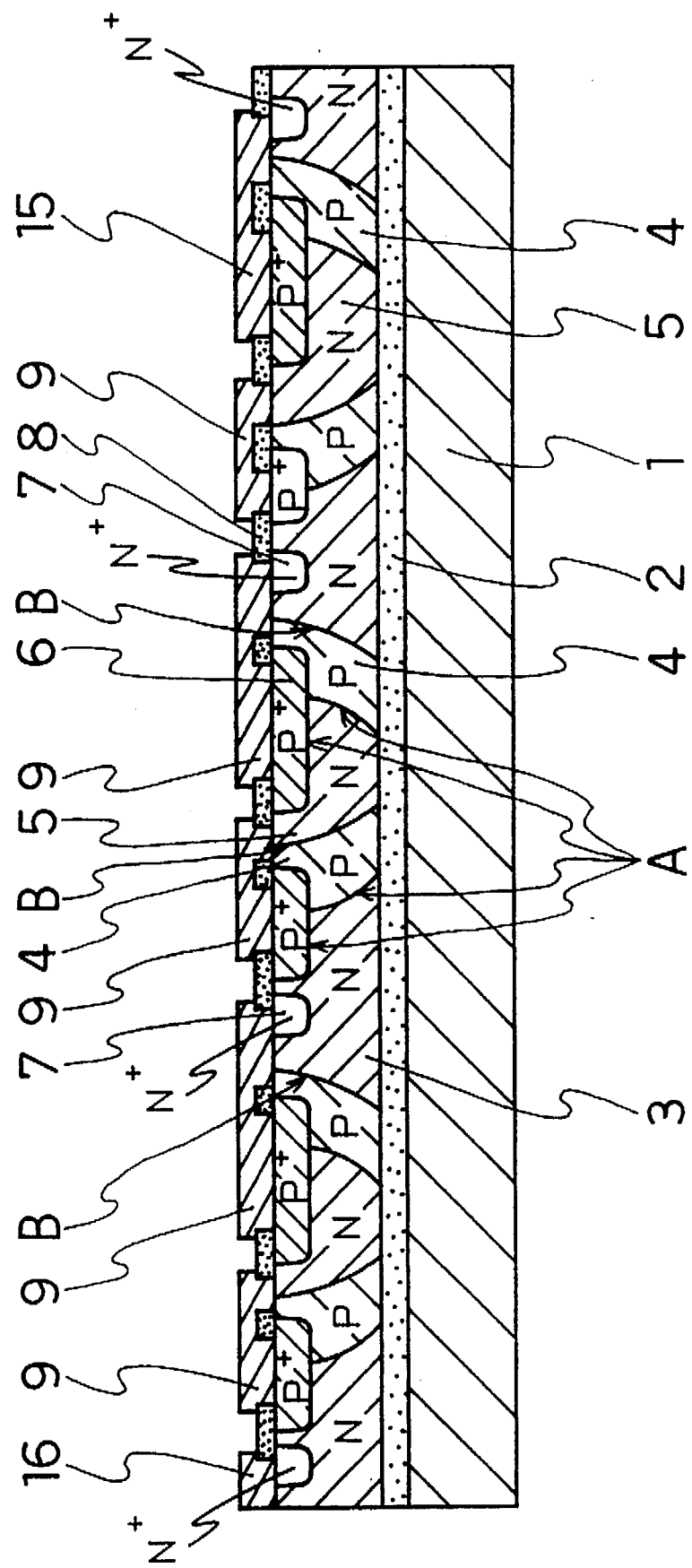
FIG. 1 is a longitudinal sectional view showing an embodiment of a photodiode array according to the present invention.

In FIG. 1, numeral 1 denotes a semiconductor substrate such as made of silicon. The semiconductor substrate 1 has a sufficient strength for supporting an active layer to be stacked thereon. Specifically, the substrate 1 is usually 200 to 500 μm thick.

On the semiconductor substrate 1, there is formed an insulating film 2 of about 0.1 to about 1 μm thickness which is composed of a silicon oxide film, silicon nitride film or the like.

Numeral 3 denotes a semiconductor layer bonded on the insulating film 2. The semiconductor layer 3 contains an impurity of first conductivity type, for example, of n-type and is polished to have a thickness of 5 to 20 μm after bonded so as to restrict the depth of diffusion to be made. In the n-type semiconductor layer 3, there are formed a plurality of impurity-diffusion layers 4 (hereinafter referred to as diffusion layers) of second conductivity type, for example, of p-type, each extending down to the insulating film 2, so that a plurality of pn junctions are arranged laterally. The width of each p-type diffusion layer 4 in the longitudinal direction is set within a range of from about 20 to about 100 μm. The diffusion layers 4 are spaced from each other so that the respective diffusion layers of adjacent cells will not be brought into contact with each other.

Within each of the p-type diffusion layers 4, there is formed a diffusion layer 5 of n-type, i.e., of the first conductivity type, which also extends down to the insulating film 2, so that a plurality of pn junctions arranged laterally are further formed within the p-type diffusion layer 4.

The pn junctions are defined between the semiconductor layer 3 of the first conductivity type, diffusion layer 4 of the second conductivity type formed in the semiconductor layer 3, and diffusion layer 5 of the first conductivity type further formed in the diffusion layer 4. Of these pn junctions, any junctions of which polarity for generation of electric charge is the same in order as the polarity for use are each provided with a diffusion layer 6 of high concentration ($p^+$-type in this embodiment), which is formed in a surface of the semiconductor layer 3 on the side opposite to the insulating film 2. Herein, the definition "the polarity for generation of electric charge is the same in order as the polarity for use" indicates any pn junction of which lefthand side is of n-type and righthand side is of p-type when the leftmost electrode 16 in the construction shown in FIG. 1 is used as negative electrode and the rightmost electrode 15 as positive electrode (refer to the junction indicated by reference character A in FIG. 1). When the polarity for use is reversed, it indicates any pn junction of which lefthand ride is of p-type and righthand side is of n-type (refer to the junction indicated by reference character B in FIG. 1). The definition "the polarity for generation of electric charge is opposite in order to the polarity for use" indicates any pn juntion having a feature opposite to that described above. The high-concentration $p^+$-type diffusion layer 6 is rode shallow, or as deep as about 1 to about 3 μm, and serves to increase the area of the pn junction A so as to increase the light-receiving area.

Also, a high-concentration diffusion layer 7 of of $n^+$-type is formed in a surface of the semiconductor layer 3 on the side opposite to the insulating film 2. This diffusion layer 7 is for providing an ohmic contact between the n-type layer and an electrode to be formed thereon. The diffusion depth of this layer 7 is usually 1 to 3 μm.

Numeral 8 denotes a protective layer formed on the n-type semiconductor layer 3. The thickness of the protective layer 8 is preferably in the range of from 0.1 to 1 μm in view of isolation by insulator. Suitable as the protective film is a film having an insulating property and approriate transparency.

Contact holes are provided in the protective film 8, and, through the contact holes, any pn junctions of which polarity for generation of electric charge is opposite direction in the polarity for use (i.e., the pn each short-circuited by means of a thin film electrode 9 junctions in reverse direction arranged between the positive electrode 15 and the negative electrode 16) are formed of a conductor metal such as aluminum or aluminum alloy. The thickness of the thin film electrode 9 is not particulary limited but is usually in the range of from 1.0 to 3.0 μm.

To be described next is a method for manufacturing a photodiode array according to the present invention.

Figure 3:
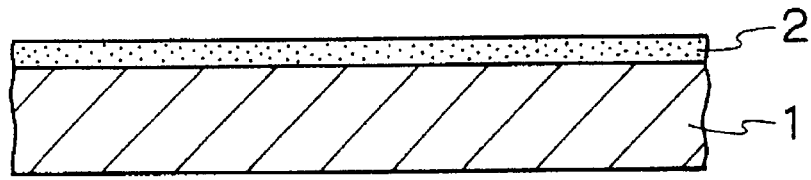
FIGS. 3 to 14 are each an explanatory sectional view for illustrating a step of the manufacturing procedure using a part of FIG. 1 for the embodiment shown in FIG. 1.

First, an insulating film 2 of an oxide is formed on a semiconductor substrate 1 (refer to FIG. 3). Specifically, a silicon oxide film is formed to have a thickness of 0.1 to 1 μm on a semiconductor substrate 1 such as made of silicon by CVD process or thermal oxidation process.

Figure 4:
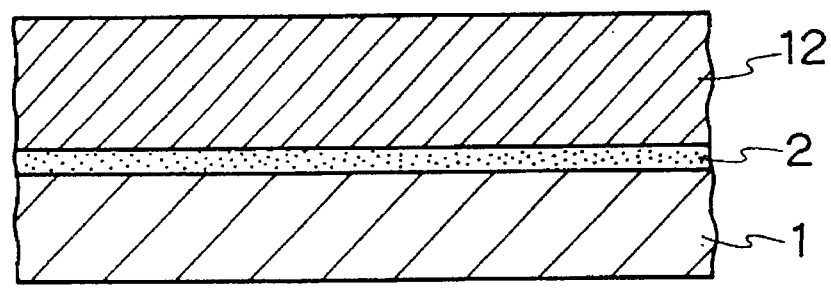

In turn, another semiconductor substrate 12 of first conductivity type (for example, of n-type) is mated back to back with the semiconductor substrate 1 formed with the insulating film 2. The substrate 12 is not formed with an oxide film. The two mated substrates are placed in a slot of a quartz boat, and heated in a furnace for diffusion at 900° to 1000° C. for a predetermined time under an atmosphere of $O_2$ gas or water vapor, thereby bonding the two substrates to each other (refer to FIG. 4).

Figure 5:
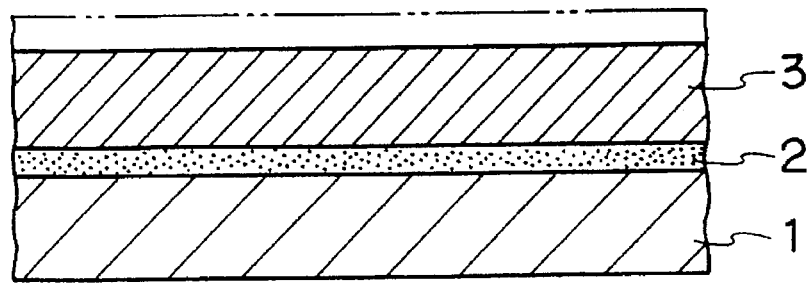

Subsequently, the surface of the n-type semiconductor substrate 12 is polished until the thickness thereof, from the insulating oxide film 2 to the surface of the substrate 12, is reduced to 5 to 20 μm. The n-type semiconductor substrate 12 bonded to the substrate 1 is used as an n-type semiconductor layer 3 (refer to FIG. 5).

Figure 6:
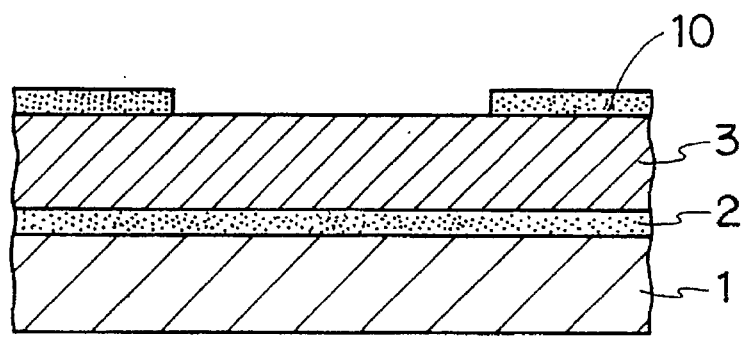

Next, a silicon oxide film 10 is formed on the surface of the n-type semiconductor layer 3. The oxide film 10 in a predetermined region is then removed using a mask for p-type diffusion to form a selective diffusion pattern (refer to FIG. 6).

Figure 7:
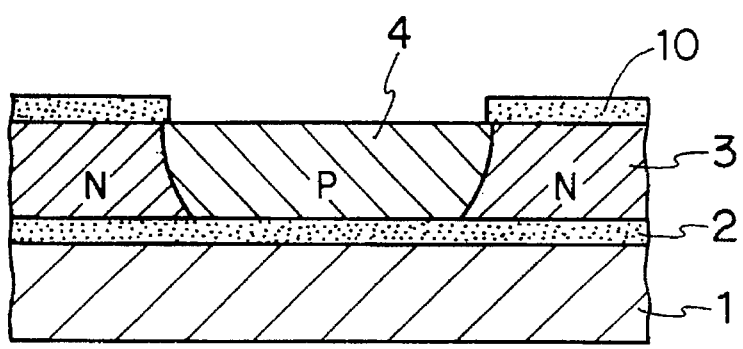

In turn, a p-type diffusion layer 4 is formed in the n-type semiconductor layer 3 using the silicon oxide film 10 thus patterned as a mask (refer to FIG. 7).

Figure 8:
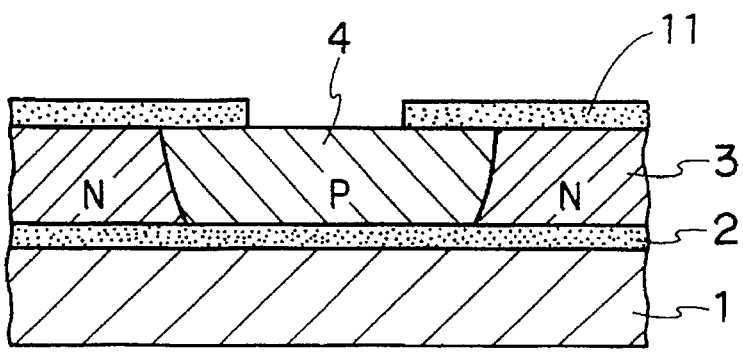

Similarly, a silicon oxide film 11 is further formed on the surface of the p-type diffusion layer 4, followed by removing the silicon oxide film 11 in a predetermined region with use of a mask for n-type diffusion to form a selective diffusion pattern (refer to FIG. 8).

Figure 9:
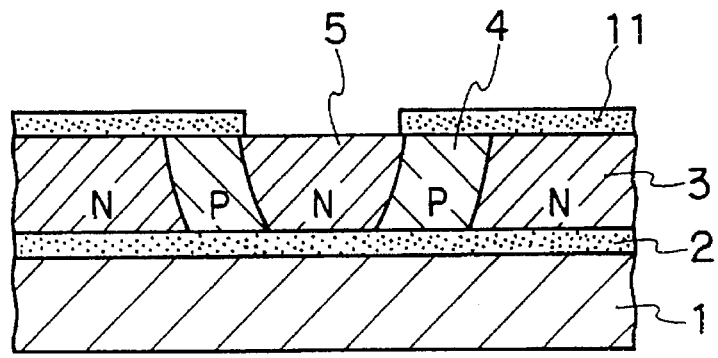

Subsequently, using the thus patterned silicon oxide as a mask, an n-type diffusion layer 5 is formed with the p-type diffusion layer 4 (refer to FIG. 9).

Figure 10:
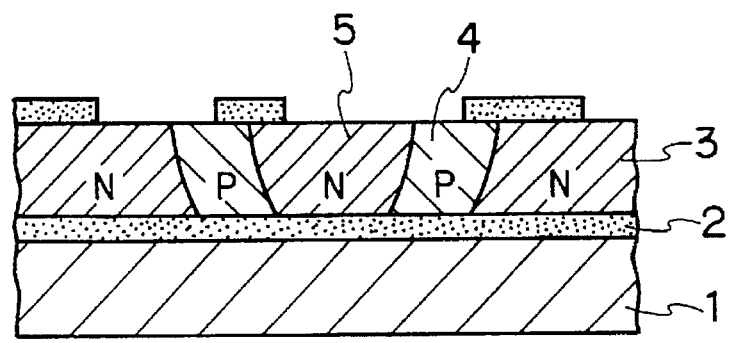
Figure 11:
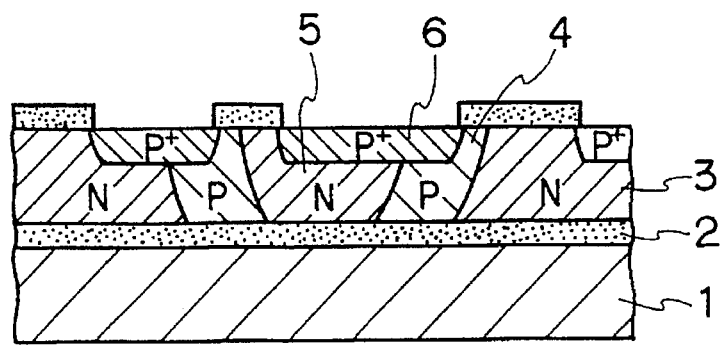
Figure 12:
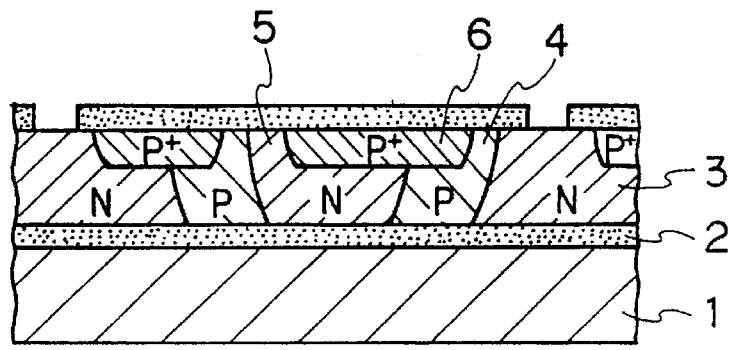
Figure 13:
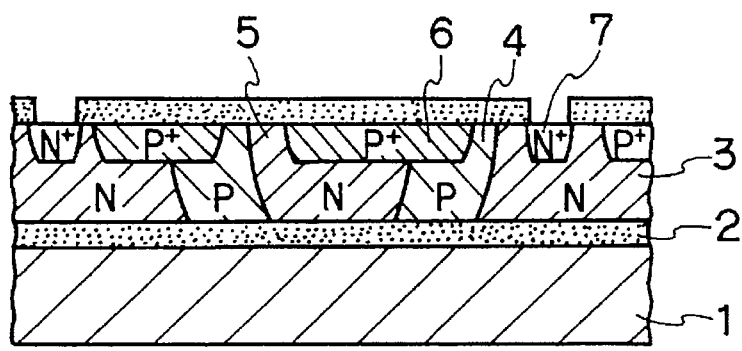

Further, for increasing the light-receiving area of pn junction as described above, a $p^+$-type diffusion layer 6 of high concentration is formed in a predetermined region of the concentric surface formed by the p-type diffusion layer and n-type diffusion layer with use of a mask of a predetermined shape (refer to FIGS. 10 and 11). Similarly, an $n^+$-type diffusion layer 7 for providing an ohmic contact between an electrode and the n-type semiconductor layer 3 is formed (refer to FIGS. 12 and 13).

Figure 14:
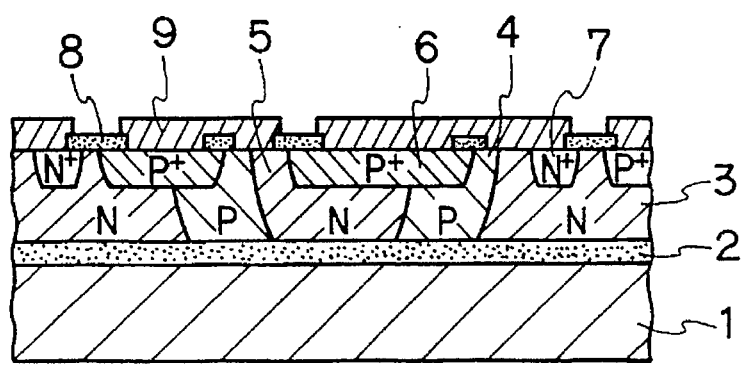
Figure 15:
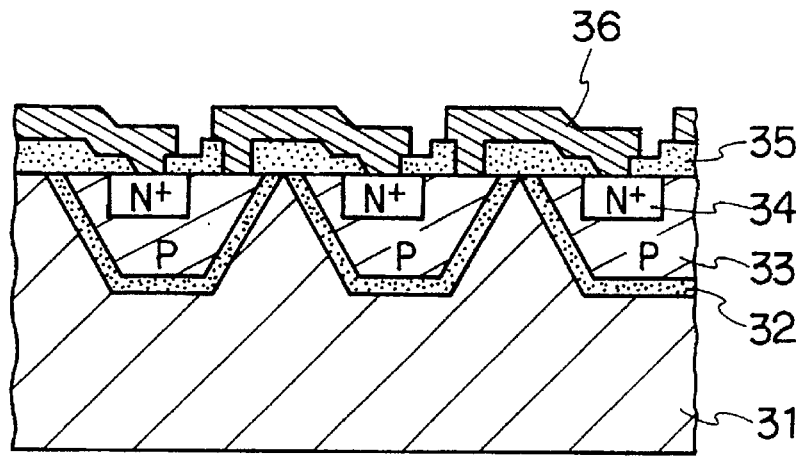
FIGS. 15 and 16 are each a longitudinal sectional view showing a prior art photodiode array.
Figure 16:
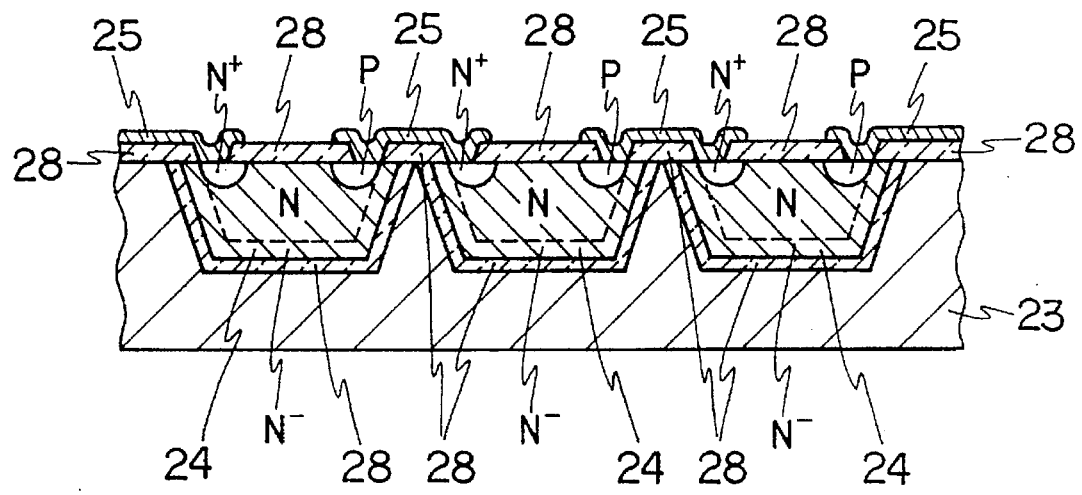
Figure 17:
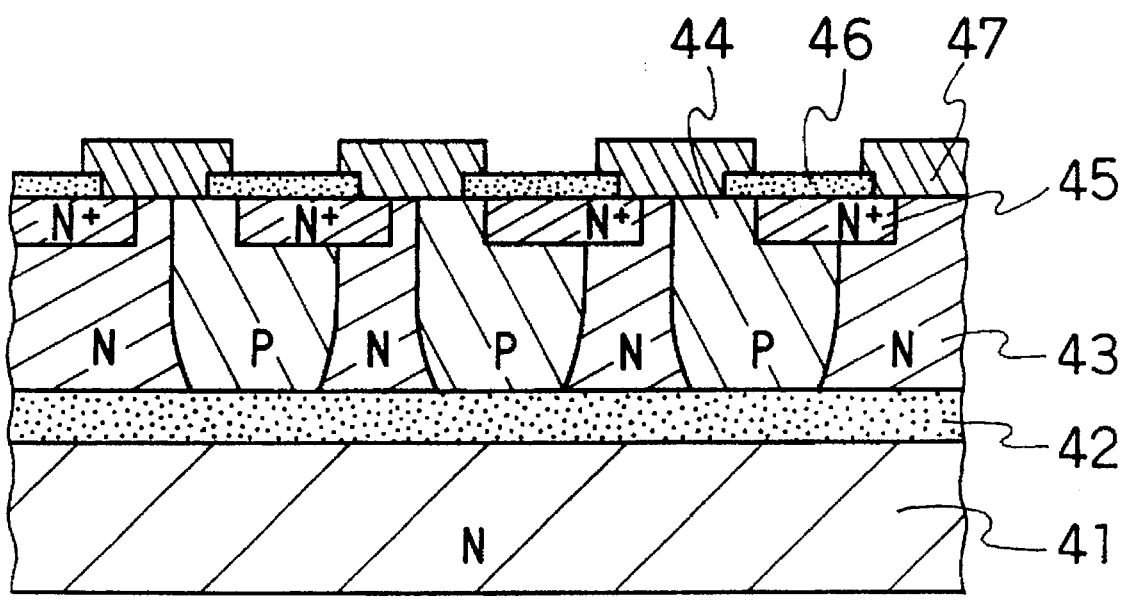
FIG. 17 is a longitudinal sectional view showing an improved photodiode array which is proposed formerly.

In turn, contact holes are formed in predetermined regions with use of a rectangular mask. An electrode material is deposited to form a film by vapor deposition or sputtering, followed by patterning the film to form a thin film electrode layer 9 on the n-type semiconductor layer 3. This electrode film is appropriately insulated by a protective film 8 such as made of a silicon oxide film (refer to FIG. 14).

Finally, a surface protective layer, bonding pad and the like are formed in a manner similar to the conventional photodiode manufacturing method, to complete a photodiode array.

In the above-mentioned embodiment, the semiconductor layer 3 of n-type was obtained by joining two semiconductor substrates with interposing the insulating film therebetween. However, the semiconductor layer 3 can be obtained by forming a seed such as an opening in the insulating film 2, thereafter epitaxially growing.

In the above description, the photodiode array is constructed by forming the p-type diffusion layer in the n-type semiconductor layer and further the n-type diffusion layer within the p-type diffusion layer. However, the semiconductor layer for use in the present invention is not limited to an n-type semiconductor layer but a p-type semiconductor layer is also suitable. When the p-type semiconductor layer is used, as a matter course the conductivity types of the diffusion layers to be formed therein need to be reversed. Further, the number of diffusion layers of p-type and n-type to be formed in the semiconductor layer is not limited to two layers consisting of the p type layer 4 and or n-type layer 5 but it may be more than two layers. Furthermore, p-type diffusion layer, n-type diffusion layer, p-type diffusion layer, can be sequentially formed in the diffusion layer. In this embodiment, there is shown an example of p-type diffusion layer 4, number of which is three, but the number can be selected depending on the desired number of pn junction. In the above embodiment of the manufacturing method, the insulating film 2 and the masks 10 and 11 for diffusion are each formed of a silicon oxide film. However, a silicon nitride film or an insulating film of another type may be used to form them.

Further, the structure shown in FIG. 1 of the above embodiment, the left side electrode and the right side electrode are used as negative and positive electrodes, respectively, to utilize any pn junction of which lefthand side is of n-type and righthand side is of p-type. However, the polarities of the electrodes may be reversed to utilize any pn junction of which lefthand side is of p-type and righthand side is of n-type. In this case, any pn junction of which lefthand side is of n-type and righthand side is of p-type is short-circuited at the surface thereof by the thin film electrode layer.

Figure 2A:
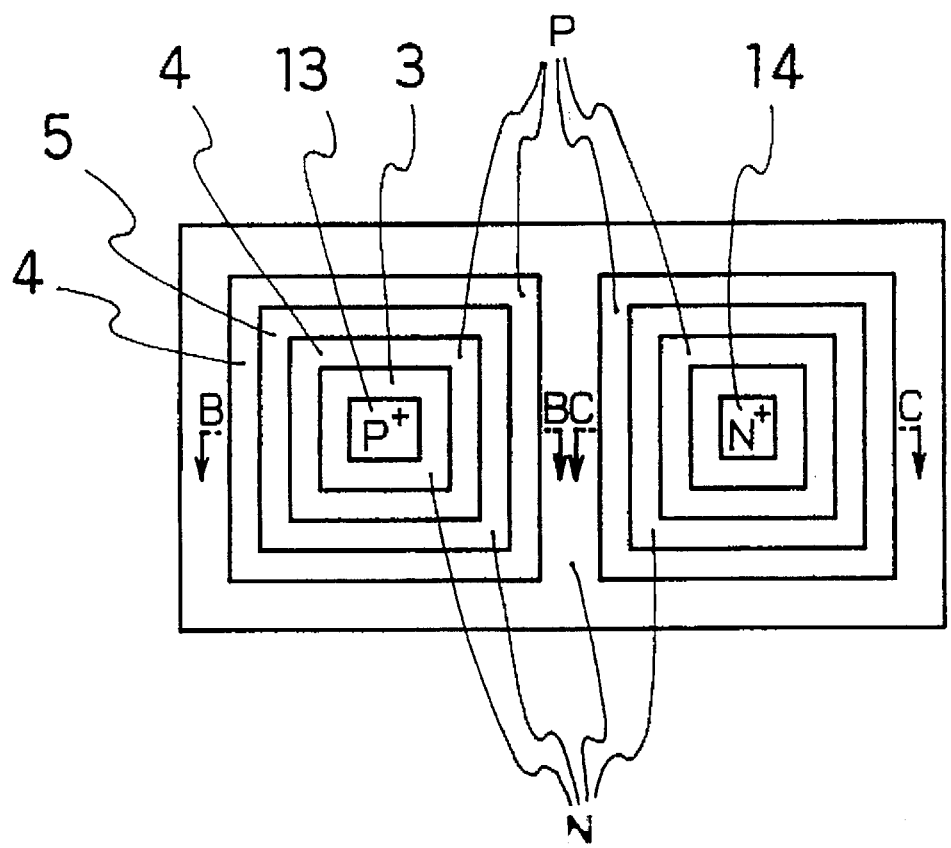
FIGS. 2(a) to 2(c) are each explanatory views showing another embodiment of the present invention.
Figure 2B:
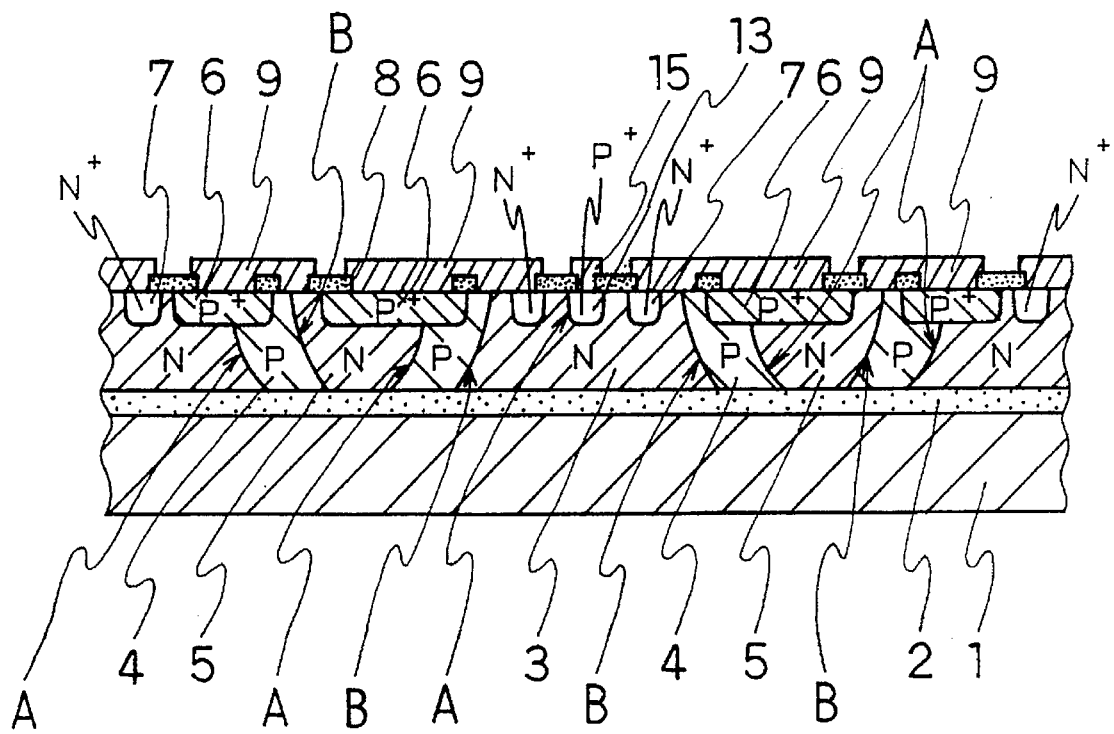
Figure 2C:
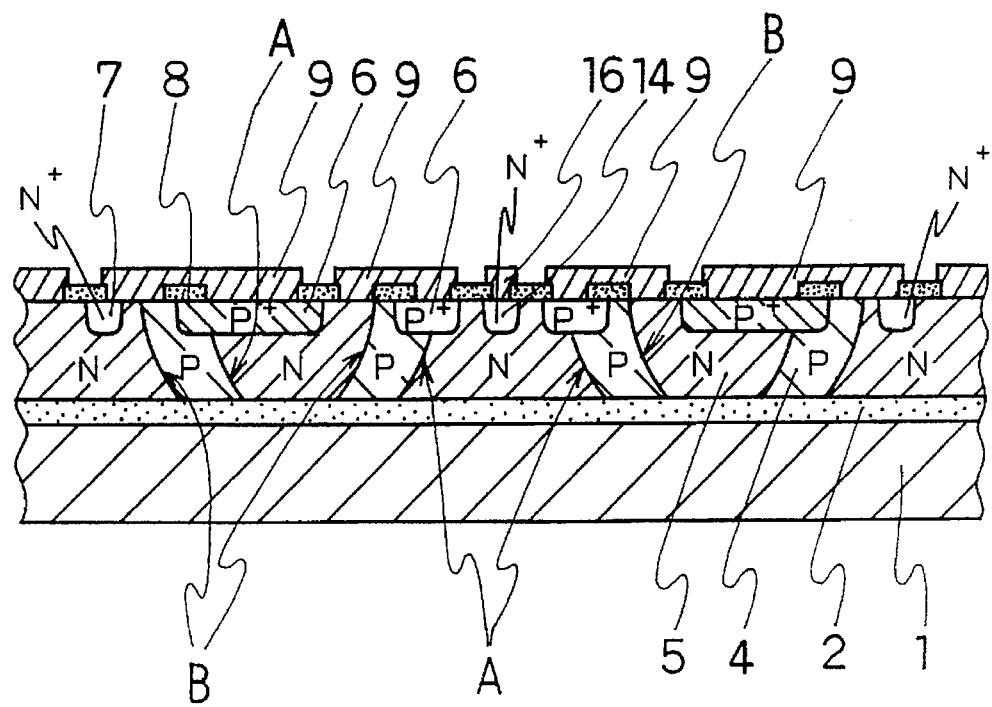

Also in the above embodiment, the p-type diffusion layer is formed in the n-type semiconductor layer and, in turn, the n-type diffusion layer is formed within the p-type diffusion layer set of which are laterally arranged. As shown in FIG. 2(a) which is a plan view thereof, and as shown in FIGS. 2(b) and 2(c) which are, respectively, a cross sectional view taken along lines B—B of FIG. 2(a) and a cross sectional view taken along lines C—C of FIG. 2(a), thereby assuring an increased area of pn junctions in a small area of a semiconductor substrate. In FIGS. 2(a) to 2(c) when the $p^+$-region 13 is used as a positive electrode and the $n^+$-region as a negative electrode, a photodiode having five pn junctions connected in series is obtained.

If the photodiode array thus constructed and other semiconductor elements are formed on the same semiconductor substrate, then a semiconductor integrated circuit device can be readily obtained.

As has been described, in the photodiode array of the present invention, a diffusion layer of second conductivity type is formed in a semiconductor layer of first conductivity type, and further, a diffusion layer of the first conductivity type is formed within the diffusion layer of the second conductivity type. These diffusion layers may be repeatedly formed to form a concentric configuration of pn junctions. Therefore, the number of pn junctions which are formed in the same area can be increased. This contributes to a reduction in chip size and in production cost.

Though several embodiments of the present invention are described above, it is to be understood that the present invention is not limited only to the above-mentioned, various changes and modifications may be made in the invention without departing from the spirit and scope thereof.

What is claimed is:

1. A photodiode array comprising:

an insulating film;

a semiconductor layer of a first conductivity type provided on said insulating film;

a positive electrode and negative electrode formed on said semiconductor layer; and a plurality of pn junctions formed in series in said semiconductor layer between said positive and negative electrodes;

wherein said pn junctions are formed by a diffusion layer of a second conductivity type formed in said semiconductor layer and another diffusion layer of the first conductivity type formed in said diffusion layer, so as to terminate on said insulating film, and wherein said pn junctions are formed concentrically and connected in series between said positive and negative electrodes.

2. The photodiode array of claim 1, wherein still another diffusion layer of second conductivity type is formed in said another diffusion layer so as to terminate on the insulating layer.

3. The photodiode array of claim 1, wherein pn junctions directed in the backward direction between said positive and negative electrodes are short-circuited by a conductive layer on said semiconductor layer.

4. The photodiode array of claim 1, wherein in said pn junctions formed in series, a shallow diffusion region of first conductivity type or second conductivity type is formed such that area of said pn junctions required therefore is enlarged.

5. An integrated circuit device comprising the photodiode of claim 1 which is integrated with other semiconductor elements.

* * * * *